(12) United States Patent
Weber et al.

(10) Patent No.: US 6,621,055 B2
(45) Date of Patent: Sep. 16, 2003

(54) THERMALLY CONTROLLED CIRCUIT USING PLANAR RESISTIVE ELEMENTS

(75) Inventors: Joseph M. Weber, Colorado Springs, CO (US); Sid J. Reyna, Colorado Springs, CO (US); Jennifer C. Roof, Monument, CO (US)

(73) Assignee: Intel Corporation, Santa Clara, CA (US)

(*) Notice: Subject to any disclaimer, the term of this patent is extended or adjusted under 35 U.S.C. 154(b) by 19 days.

(21) Appl. No.: 10/047,500

(22) Filed: Oct. 23, 2001

(65) Prior Publication Data

US 2002/0162829 A1 Nov. 7, 2002

Related U.S. Application Data

(62) Division of application No. 09/416,498, filed on Oct. 12, 1999, now abandoned.

(51) Int. Cl.[7] ................................................. H05B 1/02
(52) U.S. Cl. ........................ 219/494; 219/209; 219/210; 219/543; 219/544
(58) Field of Search ................................. 219/494, 209, 219/210, 522, 528, 543, 544, 547, 548, 549; 392/434; 338/307, 308

(56) References Cited

U.S. PATENT DOCUMENTS

| | | | | |
|---|---|---|---|---|
| 3,289,046 A | * | 11/1966 | Carr | 219/209 |
| 3,395,265 A | * | 7/1968 | Weir | 219/209 |
| 3,440,407 A | * | 4/1969 | Goltsos et al. | 219/209 |
| 3,816,702 A | * | 6/1974 | Green | 219/209 |
| 4,481,403 A | * | 11/1984 | Del Monte | 219/209 |
| 5,130,842 A | * | 7/1992 | Gauthier et al. | 219/209 |
| 5,302,810 A | * | 4/1994 | Gauthier et al. | 219/543 |
| 5,539,186 A | * | 7/1996 | Abrami et al. | 219/548 |
| 6,114,674 A | * | 9/2000 | Baugh et al. | 219/543 |
| 6,127,660 A | * | 10/2000 | Scafati | 219/209 |
| 6,127,663 A | * | 10/2000 | Jones | 219/209 |

FOREIGN PATENT DOCUMENTS

EP 0795902 A2 * 9/1997

* cited by examiner

Primary Examiner—Teresa Walberg
Assistant Examiner—Fadi H. Dahbour
(74) Attorney, Agent, or Firm—Blakely, Sokoloff, Taylor & Zafman LLP

(57) ABSTRACT

A thermally controlled circuit board is provided. The circuit board includes a substrate, which carries a thermally controlled circuit. The thermally controlled circuit includes a heater, a logic unit and a thermostat. The heater includes planar resistive elements, which are embedded into the substrate. A power source is selectively coupled to the heater via control of the logic unit. The thermostat is programmed with a temperature set point, and outputs a control signal based on a measured temperature level relative to the temperature set point. The logic unit selectively couples the power source to the heater, based on the control signal output from the thermostat and selectively couples power to on-board components to control the temperature of the board and the components thereon to protect the components and insure reliable operation.

44 Claims, 12 Drawing Sheets

| DETERMINATION OF MEASURED CPU TEMPERATURE RELATIVE TO CPU OPERATING TEMPERATURE RANGE | | |
|---|---|---|
| $T_{CPU1}$ | $T_{CPU2}$ | TEMPERATURE CONDITION |
| 0 | 0 | CPU TEMP BELOW OPERATING TEMP RANGE |
| 0 | 1 | ERROR CONDITION |
| 1 | 0 | CPU TEMP WITHIN OPERATING TEMP RANGE |
| 1 | 1 | CPU TEMP ABOVE OPERATING TEMP RANGE |

FIG. 4

| DETERMINATION OF MEASURED SIM TEMPERATURE RELATIVE TO SIM OPERATING TEMPERATURE RANGE | | |
|---|---|---|
| $T_{SIM1}$ | $T_{SIM2}$ | TEMPERATURE CONDITION |
| 0 | 0 | SIM TEMP BELOW OPERATING TEMP RANGE |
| 0 | 1 | ERROR CONDITION |
| 1 | 0 | SIM TEMP WITHIN OPERATING TEMP RANGE |
| 1 | 1 | SIM TEMP ABOVE OPERATING TEMP RANGE |

FIG. 5

| DETERMINATION OF MEASURED CPU TEMPERATURE RELATIVE TO HUMIDITY TEMPERATURE RANGE | | |
|---|---|---|
| $T_{CPU3}$ | $T_{CPU4}$ | TEMPERATURE CONDITION |
| 0 | 0 | CPU TEMP BELOW HUMIDITY TEMP RANGE |
| 0 | 1 | ERROR CONDITION |
| 1 | 0 | CPU TEMP WITHIN HUMIDITY TEMP RANGE |
| 1 | 1 | CPU TEMP ABOVE HUMIDITY TEMP RANGE |

FIG. 6

| DETERMINATION OF MEASURED SIM TEMPERATURE RELATIVE TO SIM HUMIDITY TEMPERATURE RANGE | | |
|---|---|---|
| TSIM3 | TSIM4 | TEMPERATURE CONDITION |
| 0 | 0 | SIM TEMP BELOW HUMIDITY TEMP RANGE |
| 0 | 1 | ERROR CONDITION |
| 1 | 0 | SIM TEMP WITHIN HUMIDITY TEMP RANGE |
| 1 | 1 | SIM TEMP ABOVE HUMIDITY TEMP RANGE |

FIG. 7

SET POINT TEMPERATURES AND HYSTERESIS TEMPERATURES FOR THERMOSTATS

| | 1ST CPU THERMOSTAT | 2ND CPU THERMOSTAT | 1ST SIM THERMOSTAT | 2ND SIM THERMOSTAT |
|---|---|---|---|---|
| LOW SET | −20° C (−25° C) | −10° C (−15° C) | −15° C (−20° C) | −10° C (−15° C) |
| HIGH SET | +70° C (+65° C) | +55° C (+50° C) | +70° C (+65° C) | +55° C (+50° C) |

CPU, SIM, LOW-POWER HEATER, AND HIGH-POWER HEATER STATES, ASSUMING RISE IN CIRCUIT BOARD TEMPERATURE

| CPU AND SIM TEMPERATURE | STATE OF CPU, SIM, LOW-POWER HEATER AND HIGH-POWER HEATER |
|---|---|
| CPU BELOW -20°C OR SIM BELOW -15°C | CPU AND SIM OFF, LOW-POWER AND HIGH-POWER HEATERS ON (TRANSIENT HEATER ON) |
| CPU AT -20°C AND SIM AT -15°C | CPU AND SIM ON, LOW-POWER AND HIGH-POWER HEATERS ON (TRANSIENT HEATER ON) |
| CPU AND SIM AT -10°C | CPU AND SIM ON, LOW-POWER HEATER ON AND HIGH-POWER HEATER OFF (HUMIDITY HEATER ON) |
| CPU OR SIM AT 55°C | CPU AND SIM ON, LOW-POWER AND HIGH-POWER HEATERS OFF |
| CPU OR SIM AT 70°C | CPU AND SIM OFF, LOW-POWER AND HIGH-POWER HEATERS OFF |

Fig. 10

CPU, SIM, LOW-POWER HEATER, AND HIGH-POWER HEATER STATES, ASSUMING FALL IN CIRCUIT BOARD TEMPERATURE

| CPU AND SIM TEMPERATURE | STATE OF CPU, SIM, LOW-POWER HEATER AND HIGH-POWER HEATER |
|---|---|
| CPU OR SIM ABOVE 65°C | CPU AND SIM OFF, LOW-POWER AND HIGH-POWER HEATERS OFF |
| CPU AND SIM AT 65°C | CPU AND SIM ON, LOW-POWER AND HIGH-POWER HEATERS OFF |
| CPU AND SIM AT 55°C | CPU AND SIM ON, LOW-POWER HEATER ON AND HIGH-POWER HEATER OFF (HUMIDITY HEATER ON) |
| CPU OR SIM AT -15°C | CPU AND SIM ON, LOW-POWER AND HIGH-POWER HEATERS ON (TRANSIENT HEATER ON) |
| CPU BELOW -25°C OR SIM BELOW -20°C | CPU AND SIM OFF, LOW-POWER AND HIGH-POWER HEATERS ON (TRANSIENT HEATER ON) |

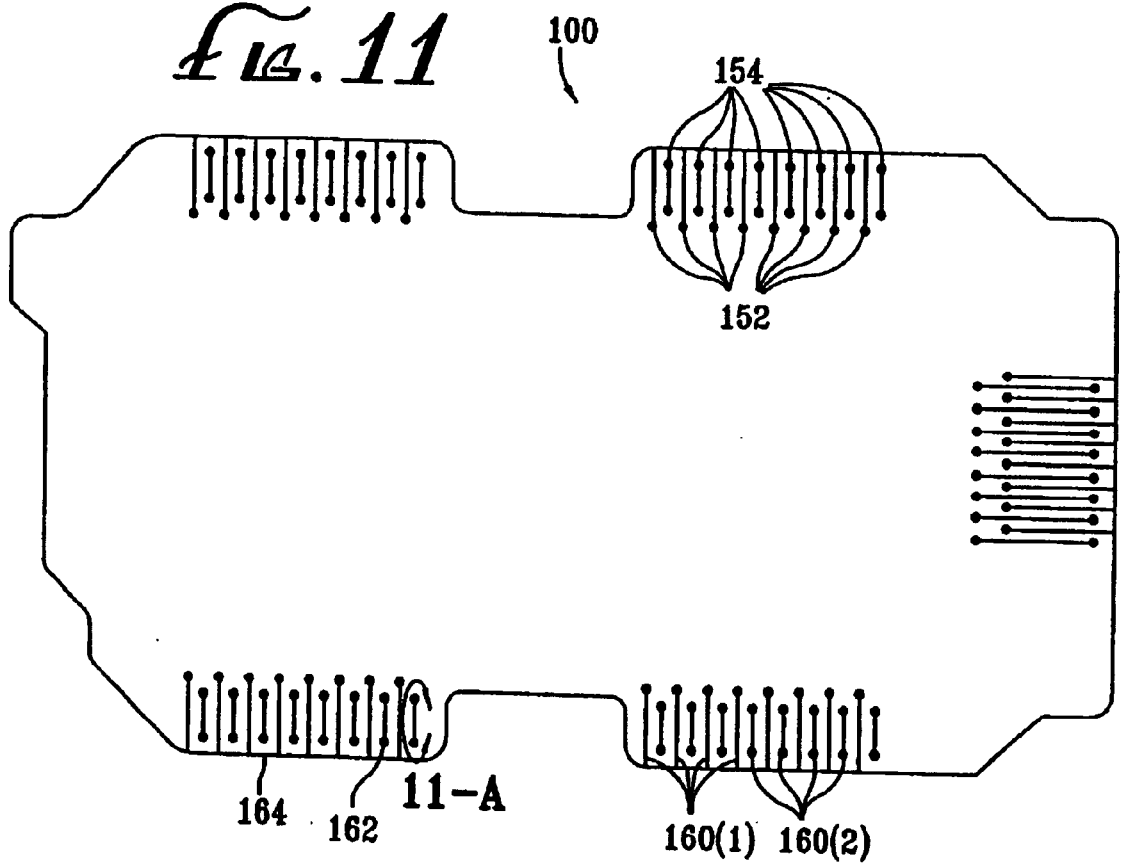
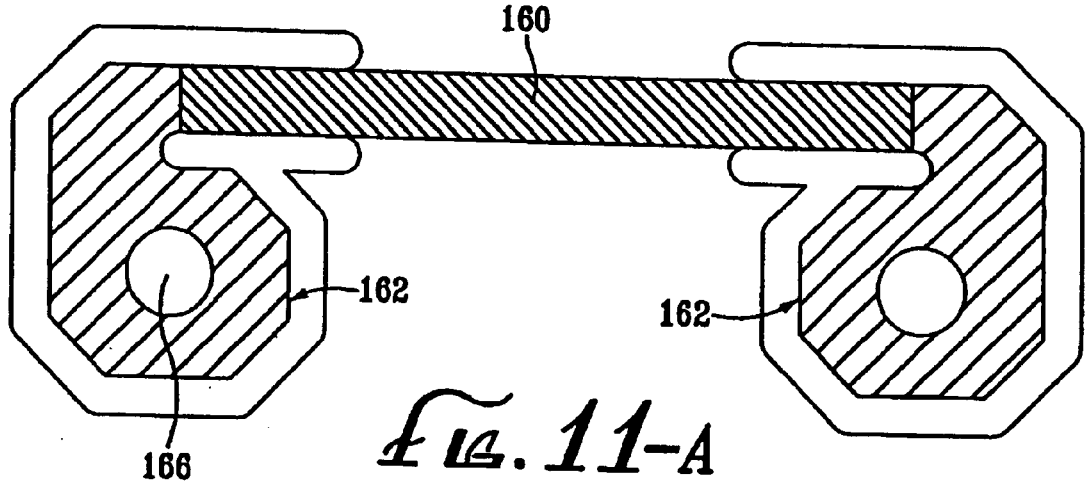

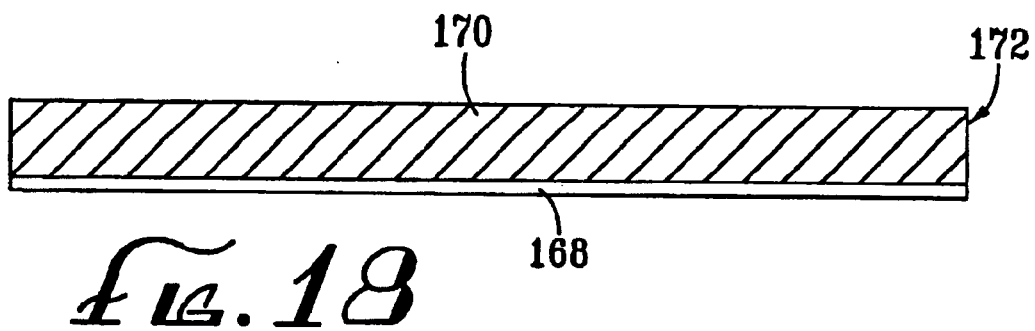
_fig.18_
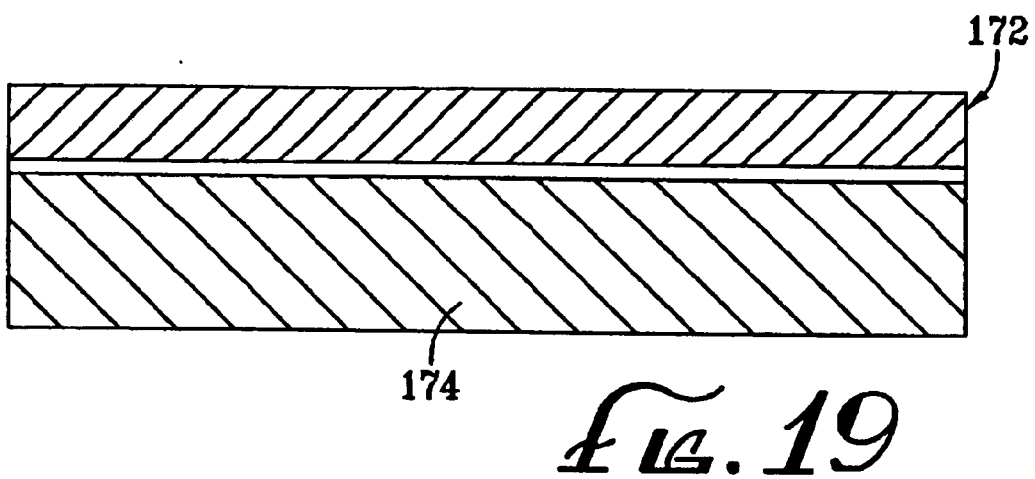
_fig.19_
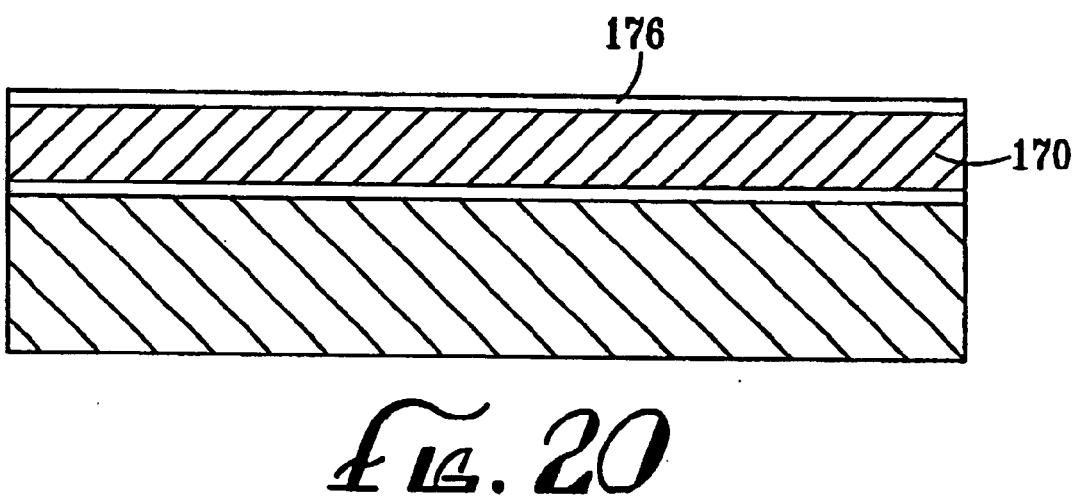
_fig.20_

THERMALLY CONTROLLED CIRCUIT USING PLANAR RESISTIVE ELEMENTS

CROSS-REFERENCE TO RELATED APPLICATION

This application is a divisional of U.S. patent application Ser. No. 09/416,498 filed on Oct. 12, 1999 now abandoned.

FIELD OF THE INVENTION

The present inventions pertain to the field of thermal control of circuits, including, more specifically, thermal control of circuit boards using resistive heaters.

BACKGROUND OF THE INVENTION

Electronics deployed in outdoor environments are often subjected to wide fluctuations in ambient air temperature, barometric pressure, and relative humidity. These environmental fluctuations can cause the electronics, and particularly a circuit board and mounted electronics components, to attain a temperature below the dew point temperature of the surrounding ambient air, allowing moisture to condense on the cooler surfaces of the electronics. Additionally, as the container in which the electronics are enclosed "breathes" (a result of changes in barometric pressure), moisture can be drawn into the container. The formation and collection of moisture on the electronics typically results in corrosion of the electronic components, thus having negative reliability implications.

Outdoor electronics are not only subjected to wide fluctuations in ambient air temperature, but are also subject to extremely cold ambient air temperature, adversely affecting transient startup of the electronics. As such, extreme operational temperature requirements are often imposed on outdoor electronics, making it necessary to purchase components that can function at temperatures as low as −40° C. (−40° F.). Industrial grade components are rated at this extreme temperature, but are much more expensive than commercial grade components. Oftentimes, industrial grade components are not even available.

One method of protecting outdoor electronics from moisture is to coat the electronics, i.e., the circuit board and associated electronic components, with a conformal coat material, which serves as a moisture barrier. Although the conformal coat reduces the rate at which moisture can come into contact with the electronics, the conformal coat is not completely impervious to moisture penetration. Additionally, this approach adds steps in the manufacturing process and has a negative impact on rework procedures. Also, if any moisture or contaminants are present on the electronics prior to application of the conformal coat, they can become trapped between the conformal coat and the electronics, in which case, corrosion of the electronics can begin immediately. Furthermore, the use of a conformal coat on the electronics does not address the requirement that the electronic components function at extreme temperature.

One method addressing this extreme temperature requirement is the use of external discrete heaters to heat the air surrounding the electronics. External discrete heaters, however, have not been previously used to prevent moisture from condensing on the electronics. Additionally, because the heaters are discrete, significant cost is added to the electronics fabrication process due to the need for external wiring, mounting hardware, additional assembly steps and stocking/storing of separate heaters. Also, because the heaters are exposed to the ambient temperature, their efficiency is reduced.

Another method addressing this extreme temperature requirement is the use of dedicated energized copper traces to provide heat to the circuit board prior to operation of the temperature sensitive electronics, as described in U.S. Pat. No. 5,896,259. The electrical resistivity of the copper traces, however, is minimal, and thus, to prevent the power source that supplies electrical energy to the copper traces from transmitting energy into a virtual short circuit, the length of the copper traces must be great enough to provide the required resistance thereto. Due to the length of these copper traces, a substantial area of the circuit board, and in some cases one or more layers of the circuit board, must be used to route the copper traces.

There thus is a need for an apparatus and method that provides a less costly and more efficient manner of thermally controlling electronic equipment during adverse environmental conditions.

SUMMARY OF THE INVENTION

The present inventions comprise a novel thermally controlled circuit board.

In a first aspect of the invention, a circuit board comprises a substrate, which can be either rigid or flexible. The circuit board further includes a heater. By way of nonlimiting example, the heater can include one or more planar resistive elements, which may be embedded in or disposed on the surface of the substrate. These planar resistive elements are composed of a substantially resistive material. That is, the planar resistive elements are not highly conductive. The circuit board further includes a power source, which is selectively coupled to the heater. The circuit board further includes thermal control circuitry, which is configured for selectively coupling the power source to the heater.

In accordance with another aspect of the present inventions, the circuit board includes a substrate, which can be either rigid or flexible. The circuit board further includes a heater comprising one or more resistive elements embedded within the substrate. These embedded resistive elements are composed of a substantially resistive material. That is, the planar resistive elements are not highly conductive. In the preferred embodiment, the one or more resistive elements are planar, but can be other than planar. In the preferred embodiment, the heater is configured to dissipate a level of heat that satisfies one or more predetermined thermal criteria. The predetermined thermal criteria can include, among other things, a set temperature of the substrate above an ambient temperature to which the substrate is exposed, or a time in which a measured temperature rises to a predetermined temperature level. The circuit board can include another heater comprising one or more resistive elements embedded within the substrate. The heaters can be advantageously used as low-power and high-power heaters, providing different levels of heat dissipation to the circuit board.

In accordance with still another aspect of the present inventions, the circuit board includes a substrate, which can be either rigid or flexible. The substrate can either be formed of a single substrate layer or multiple substrate layers. The circuit board further includes a heater comprising one or more planar resistive elements carried by the substrate. If the substrate is formed of multiple substrate layers, the planar resistive elements can be carried within the multiple substrate layers or carried external to the multiple substrate layers. By way of nonlimiting example, the planar resistive elements can be arranged in a bank, and the size and number of the resistive elements can be determined based on one or more predetermined thermal criteria.

In accordance with still another aspect of the present inventions, the circuit board includes a substrate, which can be either rigid or flexible. The circuit board further includes a heater carried by the substrate. The heater is configured for dissipating a level of heat required to prevent the condensation of moisture on the circuit board. The heater can comprise embedded resistive elements and/or planar resistive elements, or even external discrete heaters.

BRIEF DESCRIPTION OF THE DRAWINGS

FIG. 1-A is a magnified view of the circuit board of FIG. 1, particularly showing the multitude of electrically conductive layers and substrate layers;

FIG. 4 is a table setting forth the output states of a thermostat programmed to indicate a measured temperature of a CPU relative to the lower and upper limits of the CPU operating temperature range;

FIG. 5 is a table setting forth the output states of a thermostat programmed to indicate a measured temperature of a SIM relative to the lower and upper limits of the SIM operating temperature range;

FIG. 6 is a table setting forth the output states of a thermostat programmed to indicate a measured temperature of a CPU relative to the lower and upper limits of a defined humidity temperature range;

FIG. 7 is a table setting forth the output states of a thermostat programmed to indicate a measured temperature of a SIM relative to the lower and upper limits of a defined humidity temperature range;

FIG. 8 is a table setting forth exemplary temperature set points of the thermostats of FIGS. 4–7;

FIG. 9 is a table setting forth the on-off states of a CPU, SIM, low-power heater, and high-power heater based on a set of rising temperature conditions;

FIG. 10 is a table setting forth the on-off states of a CPU, SIM, low-power heater, and high-power heater based on a set of falling temperature conditions;

FIG. 11 is a plan view of resistive elements of the low-power heater and high-power heater arranged on the circuit board of FIG. 1;

FIG. 11-A is a magnified view of a resistive element of FIG. 11 with associated electrically conductive contact pads;

FIGS. 18–24 are cross-section views depicting the steps in manufacturing planar resistive elements and associated electrically conductive contact pads/traces;

DETAILED DESCRIPTION OF THE PREFERRED EMBODIMENTS

Figure 1:
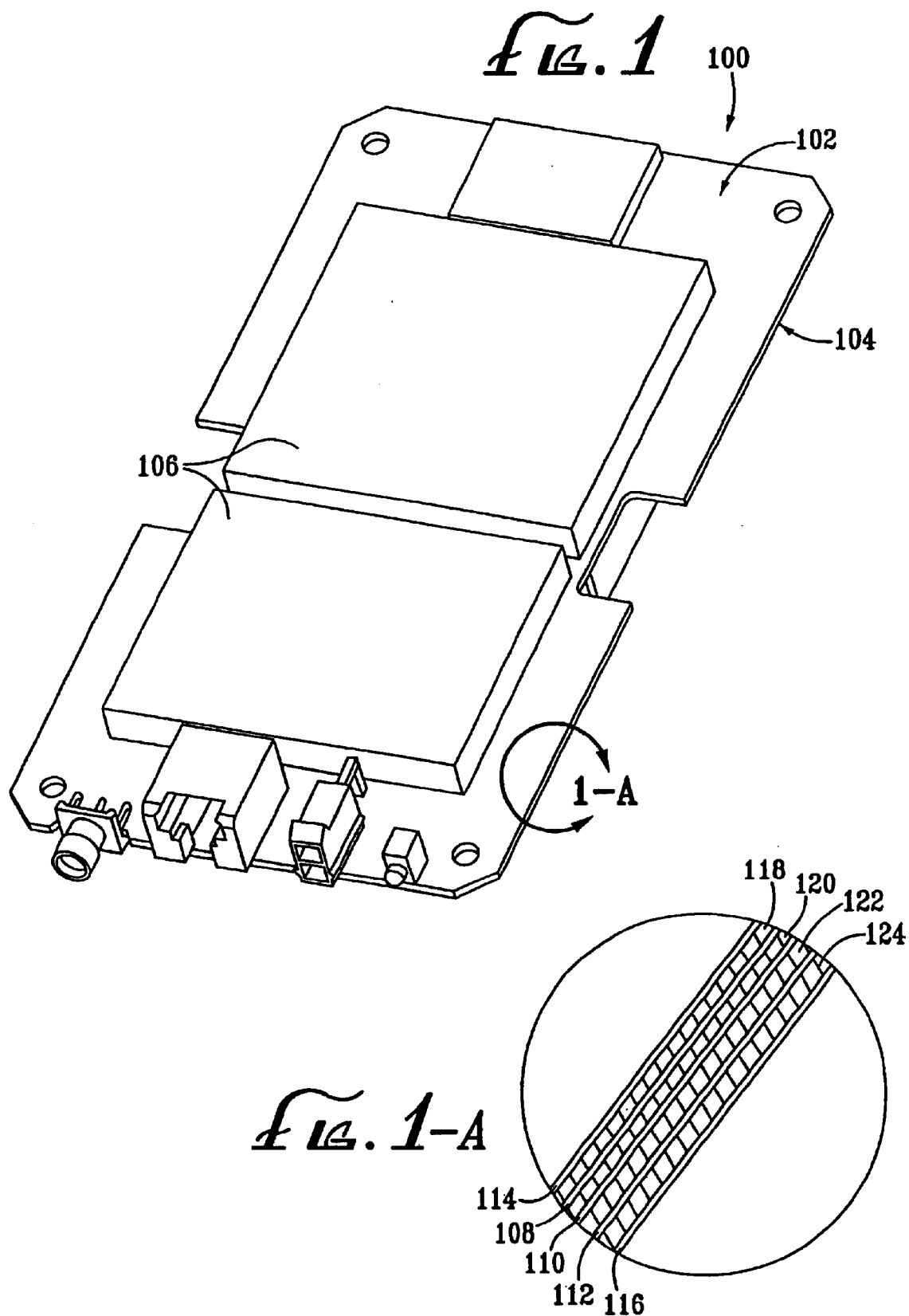
FIG. 1 is a perspective view of a circuit board constructed in accordance with the present inventions.

Referring to FIG. 1, a thermally controlled circuit board 100, which is constructed in accordance with a preferred embodiment of the present inventions, is described. The circuit board 100 includes top and bottom surfaces 102 and 104, which are both populated with electronic components (not shown). The circuit board 100 includes protective covers 106, which are disposed over the electronic components. In the illustrated embodiment (best seen in FIG. 1-A), the circuit board 100 is multi-layered and comprises internal electrically conductive power, signal, and ground layers 108, 110 and 112, and external electrically conductive signal layers 114 and 116. For the purposes of this specification, an electrically conductive layer is a layer of electrically conductive traces and/or planes of electrically conductive material and/or vias (all not shown) on a substrate layer. Although the circuit board 100 is shown with multiple electrically conductive layers, the circuit board 100 can include a single electrically conductive layer or any number of electrically conductive layers, without straying from the principles taught by this invention. Furthermore, in other embodiments, an electrically conductive layer does not have to be dedicated singly to providing power, signal or ground, but may provide any combination of the three.

The electrically conductive layers 108–116 are separated by a plurality of substrate layers 118, 120, 122, and 124, which are composed of a rigid dielectric material, such as epoxy-fiber glass or other suitable materials. In this regard, the circuit board 100 can be characterized as a printed circuit board by virtue of the substrate rigidity. Alternatively, the substrate layers 118–124 are composed of a flexible dielectric material, such as polyimide or other suitable materials. In this regard, the circuit board 100 can be characterized as a printed circuit board by virtue of the substrate flexibility.

Figure 2:
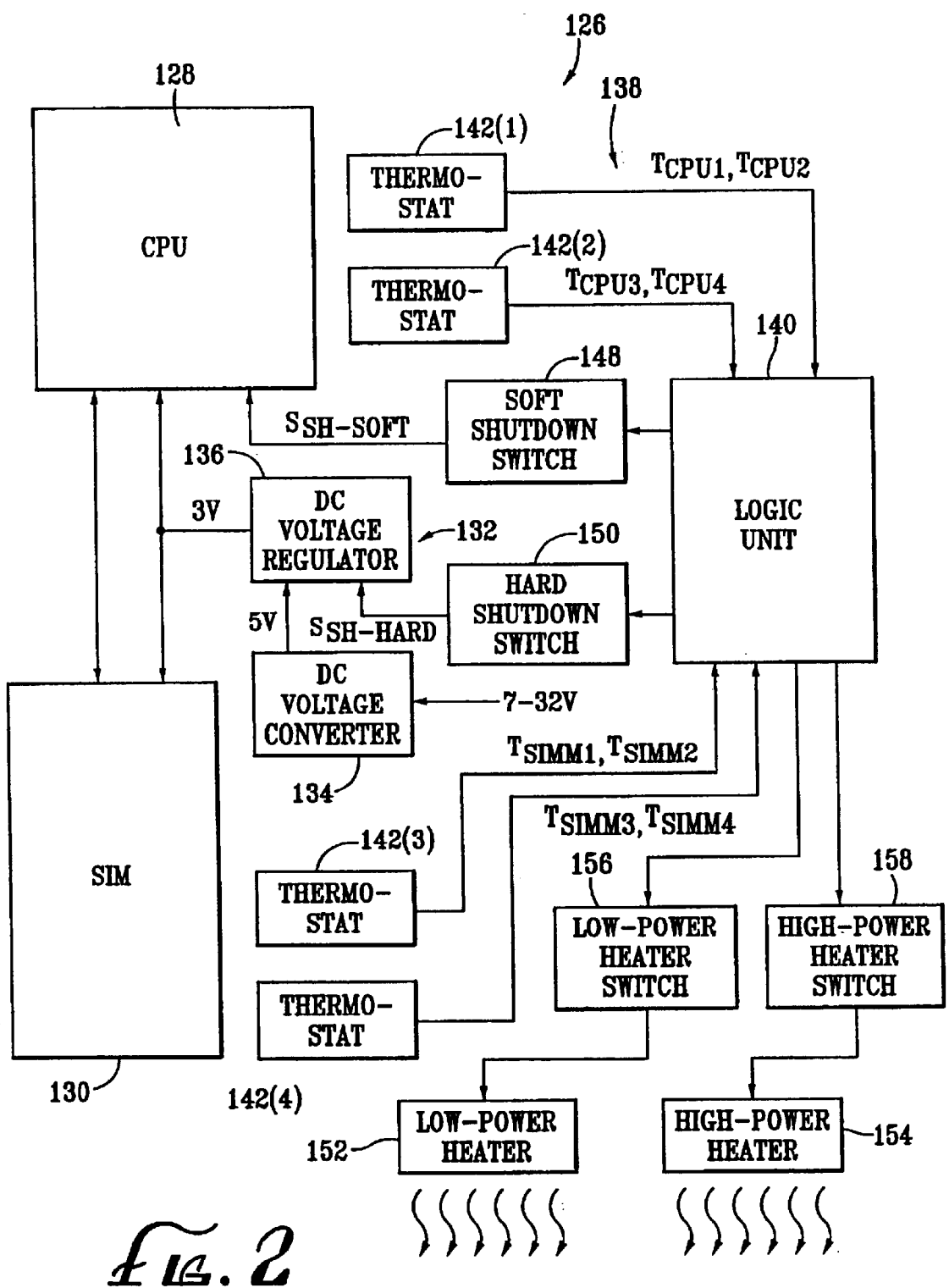
FIG. 2 is a representative block diagram of a thermally controlled circuit embodied in the circuit board of FIG. 1.

Referring to FIG. 2, the circuit board 100 includes a thermally controlled circuit 126. The thermally controlled circuit 126 includes a first operational electronic component 128 and a second operational electronic component 130, which form an integral part in effecting the fundamental functionality of the thermally controlled circuit 126. In the illustrated embodiment, the first operational electronic component 128 is a central processing unit (CPU), and the second operational electronic component 130 is a subscriber identity module (SIM). It should be noted, however, that, for the purposes of this invention, the electronic components 128 and 130 can be any components that contribute to the fundamental functionality of the thermally controlled circuit 126. By way of nonlimiting example, if the thermally controlled circuit 126 is part of a wireless communications module, the CPU 128 and SIM 130 can contribute to the baseband wireless communications functionality. It should be noted that, for purposes of brevity, only the pins of CPU 128 and SIM 130 necessary to describe the invention are illustrated. In reality, however, the CPU 128 and SIM 130 have many more pins than those illustrated.

The thermally controlled circuit 126 operates within a set voltage range, e.g., 7–32V. In this regard, the circuit board 100 includes a power source 132, which supplies power to the thermally controlled circuit 126. In the illustrated embodiment, the power source 132 comprises a DC/DC voltage converter 134, which converts the variable input DC voltage (7–32V) to a constant DC voltage, such as 5V. The power source 132 further comprises a voltage regulator 136, which is electrically coupled to the output of the DC/DC voltage converter 134, to provide a stepped-down voltage, such as 3 volts. The voltage regulator 136 directly provides power to the CPU 128 and SIM 130, whereas the DC/DC voltage converter 134 provides power to the remaining components of the thermally controlled circuit 126.

Figure 3:
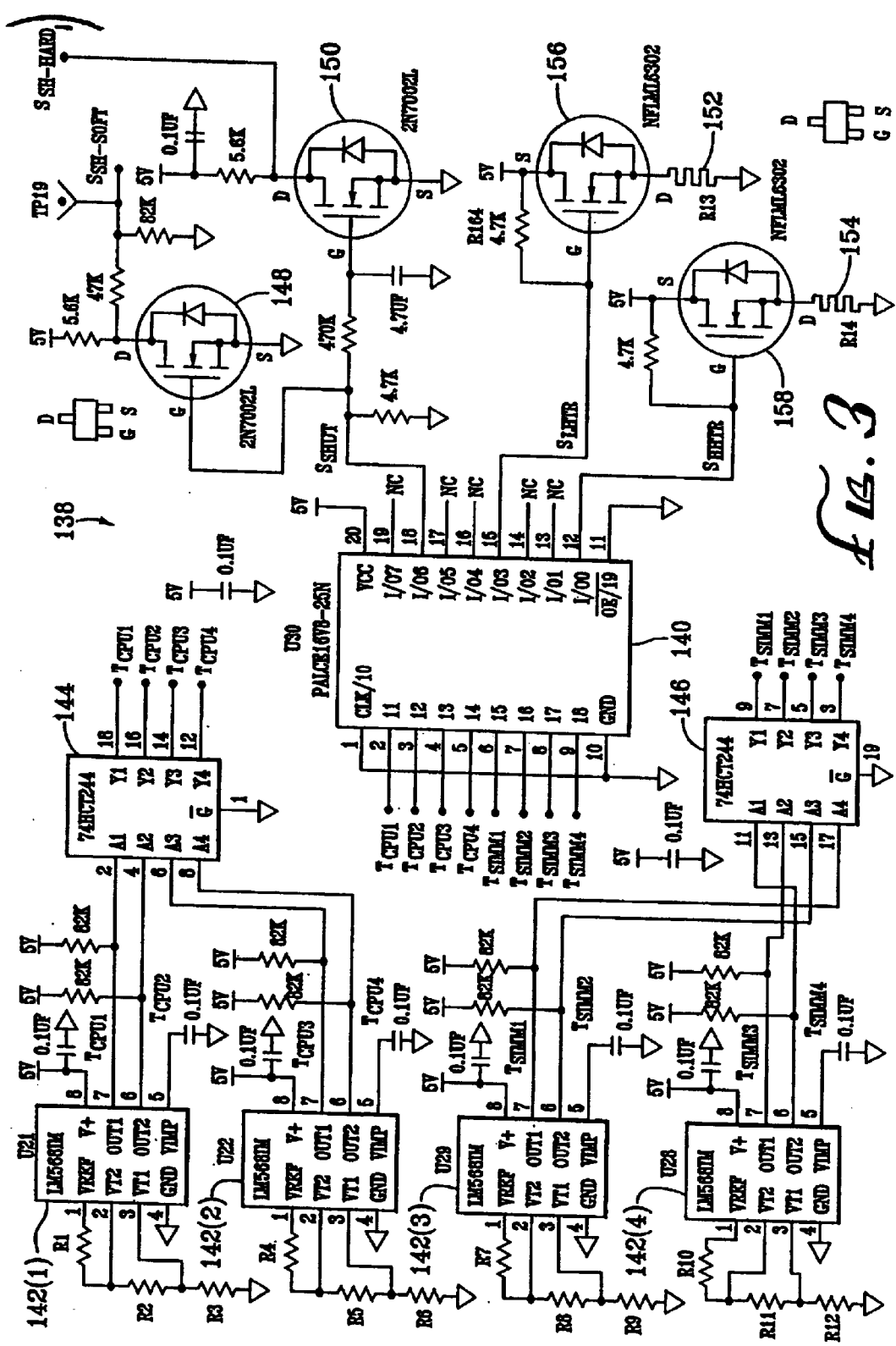
FIG. 3 is a circuit diagram of the thermally controlled circuit of FIG. 2.
Figure 12:
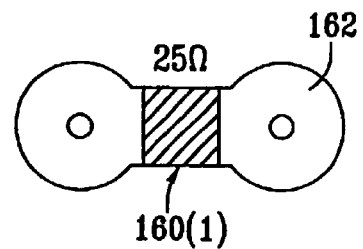
FIG. 12 is a plan view of a 25 ohm planar bar-type resistive element.
Figure 13:
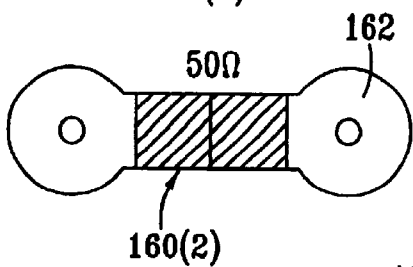
FIG. 13 is a plan view of a 50 ohm planar bar-type resistive element.
Figure 14:
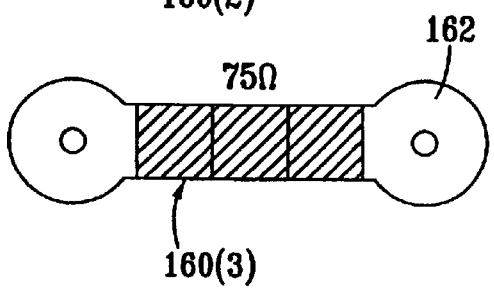
FIG. 14 is a plan view of a 75 ohm planar bar-type resistive element.
Figure 15:
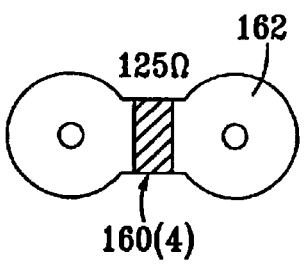
FIG. 15 is a plan view of a 12.5 ohm planar bar-type resistive element.

It is assumed that the CPU 128 and SIM 130 will be exposed to adverse environmental conditions, necessitating power and thermal control of the CPU 128 and SIM 130, as well as any other components on the circuit board 100. To effect this control, the circuit board 100 includes power/thermal control circuitry 138, which is particularly illustrated in FIG. 3. It should be noted that components illustrated in FIG. 3 are represented using standard electrical symbols with typical values and models. It should be also noted, however, that these value and model specifications only aid in the understanding of the invention and do not in any way limit the invention.

The power/thermal control circuitry 138 includes a logic unit 140 and a plurality of thermostats 142, which are divided into first and second CPU thermostats 142(1) and 142(2), respectively, and first and second SIM thermostats 142(3) and 142(4), respectively. Each of the thermostats 142 are dual-thermostat integrated circuits. In this respect, each of the thermostats 142 is programmed with a low temperature set point (at pin VT1) and a high temperature set point (at pin VT2) by selecting the values of resistors R1–R3, R4–R6, R7–R9, and R10–R12. Thus, in combination, the four thermostats 142 provide four low temperature set points and four high temperature set points. The first and second CPU thermostats 142(1) and 142(2) are advantageously located adjacent the CPU 128, thereby providing the CPU 128 with two low temperature set points and two high temperature set points, and the third and fourth thermostats 142(3) and 142(4) are advantageously located adjacent the SIM 130, thereby providing the SIM 130 with two low temperature set points and two high temperature set points. It should be noted that the number and location of thermostats 142 on the circuit board 100 is application specific. For example, a thermostat can be placed at a location of the circuit board 100 representing the coldest temperature location or median temperature location of the circuit board 100. Or if it is desired to monitor the temperature of additional components, a thermostat or thermostats can be located adjacent the additional components.

The temperature set points represent trigger temperatures at which the logic unit 140 will perform an operation. Specifically, each of the thermostats 142 outputs two logical signals (at pins OUT1 and OUT2), based upon a comparison between a measured temperature (at pin VTMP) and the low and high temperature set points. It should be noted that capacitors are connected between the temperature measurement pins VTMP of each of the thermostats 142 and ground to prevent noise interference from entering the temperature measurement pins VTMP.

As depicted in FIG. 3, the first and second CPU thermostats 142(1) and 142(2), and the first and second SIM thermostats 142(3) and 142(4) logical output signals $T_{CPU1}$, $T_{CPU2}$, $T_{CPU3}$, $T_{CPU4}$, $T_{SIM1}$, $T_{SIM2}$, $T_{SIM3}$, and $T_{SIM4}$. When the measured temperature, i.e., the lead temperature, exceeds a temperature set point, the corresponding logical output signal for that temperature set point will switch from high to low. To prevent or minimize cycling, which may otherwise occur due to fluctuations in measured temperature, hysteresis is built into each of the thermostats 142. That is, after a temperature set point is exceeded, the lead temperature must fall below the temperature set point to a certain level before the corresponding logical output signal switches from low to high. The temperature at which the corresponding logical output signal switches from low to high is referred to as the hysteresis temperature. In the illustrated embodiment, the thermostats 142 have a built-in temperature hysteresis of 5° C., such that the logical output signal switches from low to high when the lead temperature falls 5° C. below the temperature set point. Alternatively, the thermostats 142 can have a different built-in temperature hysteresis, or can even have a programmable temperature hysteresis to conveniently provide user selection of the temperature hysteresis value.

The logic unit 140 is coupled to the outputs of each of the thermostats 142 to receive the logical signals output from the thermostats 142. To minimize any incompatibility between the logic unit 140 and the thermostats 142, a buffer 144 (shown only in FIG. 3) is preferably placed between the inputs of the logic unit 140 and outputs of the first and second CPU thermostats 142(1) and 142(2), and a buffer 146 (shown only in FIG. 3) is preferably placed between the inputs of the logic unit 140 and outputs of the first and second SIM thermostats 142(3) and 142(4). In response to the logical signals output from the thermostats 142, the logic unit 140 effects power and temperature control, based on certain predetermined criteria.

With regard to power control, the power/thermal control circuitry 138 alternately effects shutdown and startup of the CPU 128 and SIM 130 (as well as any other circuitry associated with the circuit board 100), based upon certain power control criteria. Specifically, the CPU 128 and SIM 130 are only operated when the temperatures of the CPU 128 and SIM 130 are within their respective operating temperature ranges. To determine the actual temperature of the CPU 128 in comparison with the operating temperature range of the CPU 128, the low and high temperature set points of the first CPU thermostat 142(1) respectively coincide with (or are at least indicative of) the low and high limits of the operating temperature range of the CPU 128. Likewise, to determine the actual temperature of the SIM 130 in comparison with the operating temperature range of the SIM 130, the low and high temperature set points of the first SIM thermostat 142(3) respectively coincide with (or are at least indicative of) the low and high limits of the operating temperature range of the SIM 130.

Thus, as shown in FIG. 4, when the logical signals $T_{CPU1}$, and $T_{CPU2}$ output from the first CPU thermostat 142(1) are both low, the measured temperature of the CPU 128 is below the operating temperature range of the CPU 128. When the logical signals $T_{CPU1}$ and $T_{CPU2}$ are respectively low and high, an error condition exists. This state has been included for the purposes of comprehensiveness, and cannot exist in a fully functional circuit board 100. When the logical signals $T_{CPU1}$ and $T_{CPU2}$ are respectively high and low, the measured temperature of the CPU 128 is within the operating temperature range of the CPU 128. When the logical signals $T_{CPU1}$ and $T_{CPU2}$ are both high, the measured temperature of the CPU 128 is above the operating temperature range of the CPU 128.

Likewise, as shown in FIG. 5, when the logical signals $T_{SIM1}$ and $T_{SIM2}$ output from the first SIM thermostat 142(3) are both low, the measured temperature of the SIM 130 is below the operating temperature range of the SIM 130. When the logical signals $T_{SIM1}$ and $T_{SIM2}$ are respectively low and high, an error condition exists. This state has been included for the purposes of comprehensiveness, and cannot exist in a fully functional circuit board 100. When the logical signals $T_{SIM1}$ and $T_{SIM2}$ are respectively high and low, the measured temperature of the SIM 130 is within the operating temperature range of the SIM 130. When the logical signals $T_{SIM1}$ and $T_{SIM2}$ are both high, the measured temperature of the SIM 130 is above the operating temperature range of the SIM 130.

The logic unit 140 effects alternate shutdown and startup of the CPU 128 and SIM 130 via soft and hard shutdown switches 148 and 150. The soft shutdown switch 148 is electrically coupled to an input/output pin (not shown) of the CPU 128 to provide a soft shutdown switch signal $S_{SH-SOFT}$ thereto. As particularly depicted in FIG. 3, the output of the DC/DC voltage converter 134 (in this case, 5 volts) and the input/output pin (not shown) of the CPU are electrically coupled to ground through the soft shutdown switch 148, such that the soft shutdown switch signal $S_{SH-SOFT}$ is low when the soft shutdown switch 148 is closed, and the soft shutdown switch signal $S_{SH-SOFT}$ is high when the soft shutdown switch 148 is open. In the illustrated embodiment, the CPU 128 is programmed to perform a shutdown sequence in response to the appearance of a low soft shutdown switch signal $S_{SH-SOFT}$ on the input/output pin of the CPU 128. The logic unit 140 is operatively coupled to the soft shutdown switch 148, such that the soft shutdown switch 148 can be alternately opened and closed by the logic unit 140 via a shutdown control signal $S_{SHUT}$.

The hard shutdown switch 150 is electrically coupled to a shutdown control pin (not shown) of the DC voltage regulator 136 to provide a hard shutdown switch signal $S_{SH-HARD}$ thereto. As particularly depicted in FIG. 3, the output of the DC/DC voltage converter 134 (in this case, 5 volts) and the shutdown control of the DC voltage regulator 136 (shown in FIG. 2) are electrically coupled to ground through the hard shutdown switch 150, such that the hard shutdown signal $S_{SH-HARD}$ is low when the hard shutdown switch 150 is closed, and the hard shutdown signal $S_{SH-HARD}$ is high when the hard shutdown switch 150 is open. A low hard shutdown signal $S_{SH-HARD}$ turns off the DC voltage regulator 136, whereas a high hard shutdown signal $S_{SH-HARD}$ turns on the regulator 136. The logic unit 140 is operatively coupled to the hard shutdown switch 150, such that the hard shutdown switch 150 can be alternately opened and closed by the logic unit 140 via the shutdown control signal $S_{SHUT}$. As depicted, an RC circuit consisting of the 470 Kohm resistor and 4.7 $\mu$F capacitor is connected between the logic unit 140 and the hard shutdown switch to provide a shutdown delay. In this manner, the CPU 128 is provided enough time to perform the shutdown sequence before the DC voltage regulator 136 is turned off.

When either the measured temperature of the CPU 128 is outside the operating temperature range of the CPU 128, as indicated by the logical signals $T_{CPU1}$ and $T_{CPU2}$ output from the first CPU thermostat 142(1), or the measured temperature of the SIM 130 is outside the operating temperature range of the SIM 130, as indicated by the logical signals $T_{SIM1}$ and $T_{SIM2}$ output from the first SIM thermostat 142(3), the soft shutdown switch 148 is closed by the logic unit 140 by transmitting the shutdown control signal $S_{SHUT}$ thereto. In this manner, a low soft shutdown signal $S_{SH-SOFT}$ is sent to the shutdown control of the CPU 128, thereby initiating the CPU shutdown sequence. The hard shutdown switch 150 is also closed by the logic unit 140 by transmitting the delayed shutdown control signal $S_{SHUT}$ (created by the RC circuit) thereto. In this manner, a low hard shutdown signal $S_{SH-HARD}$ is sent to the shutdown control of the DC voltage regulator 136, thereby turning off the DC voltage regulator 136 and subsequently preventing power flow to the CPU 128 and SIM 130. In this state, the CPU 128 and SIM 130, as well as any other components on the circuit board 100, are turned off. In should be noted that, in alternative embodiments, the soft shutdown switch 148 is omitted, in which case, the hard shutdown switch 150 is closed by the logic unit 140 without sending a low soft shutdown signal $S_{SH-SOFT}$ to the shutdown control of the CPU 128.

Conversely, when either the measured temperature of the CPU 128 is within the operating temperature range of the CPU 128, as indicated by the logical signals $T_{CPU1}$ and $T_{CPU2}$ output from the first CPU thermostat 142(1), or when the measured temperature of the SIM 130 is within the operating temperature range of the SIM 130, as indicated by the logical signals $T_{SIM1}$ and $T_{SIM2}$ output from the first SIM thermostat 142(3), the hard shutdown switch 150 is opened by the logic unit 140. In this manner, a high hard shutdown signal $S_{SH-HARD}$ is sent to the shutdown control of the DC voltage regulator 136. In response to the high hard shutdown signal $S_{SH-HARD}$, the regulator 136 is powered on, subsequently providing power flow to the CPU 128 and SIM 130. In this state, the CPU 128 and SIM 130 are turned on.

The adverse environmental conditions to which the circuit board 100 is subjected not only necessitates power control of the CPU 128 and SIM 130, but also necessitates thermal control of the CPU 128 and SIM 130. In this regard, the power/thermal control circuitry 138 further includes heaters, and particularly a low-power heater 152 and a high-power heater 154. As will be discussed in further detail below, the low-power heater 152 and high-power heater 154 each includes several banks of resistive elements (represented by resistors R13 and R14 in FIG. 3), which serve to heat the circuit board 100, and thus the CPU 128 and SIM 130. The resistive elements are composed of a substantially resistive material. For the purposes of this specification, a substantially resistive material is any material, such as Nichrome, Monel, Lead or Nickel-Phosporous, that is traditionally known in the art as being used to provide components with a resistive characteristic. For example, although highly conductive copper has a nominal resistance value, it is not substantially resistive material for the purposes of this specification.

Based upon certain thermal criteria, the power/thermal control circuitry 138 effects alternate shutdown and startup of the low-power heater 152 and high-power heater 154 via a low-power heater switch 156 and a high-power heater switch 158, respectively. The low-power heater switch 156 is electrically coupled to the low-power heater 152 to alternately provide and prevent the flow of power thereto. In particular, the output of the DC/DC voltage converter 134 (in this case, 5 volts) is electrically coupled to the input of the low-power heater 152 through the low-power heater switch 156. The logic unit 140 is operatively coupled to the low-power heater switch 156, such that the low-power heater switch 156 can be alternately opened and closed by the logic unit 140 via a low-power heater control signal $S_{LHTR}$. The high-power heater switch 158 is electrically coupled to the high-power heater 154 to alternately provide and prevent the flow of power thereto. In particular, the output of the DC/DC voltage converter 134 is electrically coupled to the input of the high-power heater 154 through the high-power heater switch 158. The logic unit 140 is operatively coupled to the high-power heater switch 158, such that the high-power heater switch 158 can be alternately opened and closed by the logic unit 140 via a high-power heater control signal $S_{HHTR}$.

In accordance with a first thermal criterion, the power/thermal control circuitry 138 provides the CPU 128 and SIM 130 with a reasonable start-up time when the CPU 128 and SIM 130 have been subjected to an ambient temperature below their operating temperature ranges. That is, the power/thermal control circuitry 138 is capable of heating the CPU 128 and SIM 130 to a temperature within their respective operating ranges in a predetermined time during extreme low temperature conditions.

Thus, when the CPU 128 and SIM 130 are to be operated, and when the measured temperature of either the CPU 128 or SIM 130 is below the respective operating temperature range of the CPU 128 or SIM 130 (as indicated by logical signals $T_{CPU1}$ and $T_{CPU2}$ output from the first CPU thermostat 142(1) and logical signals $T_{SIM1}$ and $T_{SIM2}$ output from the first SIM thermostat 142(3)), the low-power heater switch 156 and the high-power heating switch 158 are both closed, thereby providing power flow to the low-power heater 152 and high-power heater 154. In this state, the low-power heater 152 and high-power heater 154 are both turned on. Thus, maximum heat is provided to the circuit board 100 during extremely cold conditions, which is especially crucial during startup, when the time necessary to heat the CPU 128 and SIM 130 to a temperature within the operating range of the CPU 128 and SIM 130 must be less than a maximum time period. It should be noted that a transient condition exists when the provision of maximum heat to the circuit board 100 is desired, such as when the temperature of either the CPU 128 or SIM 130 is below the respective operating temperature ranges of the CPU 128 and SIM 130. When both heaters are turned on, the low-power heater 152 and high-power heater 154 can be considered, in combination, as a transient heater.

In accordance with a second thermal criterion, the temperature/control circuitry 138 ensures that the circuit board 100 is slowly heated to a temperature above the dew point temperature of the surrounding air. In this manner, moisture is prevented from condensing on the surface of the circuit board 100, without unduly subjecting the circuit board 100 to thermal stress. This is accomplished by operating only the low-power heater 152 in a defined temperature range within the operating temperature range. For the purposes of this specification, the defined temperature range will be called the humidity temperature range. When the temperature of both the CPU 128 and SIM 130 are within the humidity temperature range, a humidity condition exists. When solely operated, the low-power heater 152 can be considered a humidity heater.

To determine the actual temperature of the CPU 128 in comparison with the defined humidity temperature range, the low and high temperature set points of the second CPU thermostat 142(2) coincide with (or are at least indicative of) the low and high limits of the defined humidity temperature range. Likewise, to determine the actual temperature of the SIM 130 in comparison with the operating temperature range of the SIM 130, the low and high temperature set points of the second SIM thermostat 142(4) coincide with (or are at least indicative of) the low and high limits of the defined humidity temperature range.

Thus, as shown in FIG. 6, when the logical signals $T_{CPU3}$ and $T_{CPU4}$ output from the second CPU thermostat 142(2) are both low, the measured temperature of the CPU 128 is below the humidity temperature range. When the logical signals $T_{CPU3}$ and $T_{CPU4}$ are respectively low and high, an error condition exists. This state has been included for the purposes of comprehensiveness, and cannot exist in a fully functional circuit board 100. When the logical signals $T_{CPU3}$ and $T_{CPU4}$ are respectively high and low, the measured temperature of the CPU 128 is within the humidity temperature range of the CPU 128. When the logical signals $T_{CPU3}$ and $T_{CPU4}$ are both high, the measured temperature of the CPU 128 is above the humidity temperature range of the CPU 128.

Likewise, as shown in FIG. 7, when the logical signals $T_{SIM3}$ and $T_{SIM4}$ output from the second SIM thermostat 142(4) are both low, the measured temperature of the SIM 130 is below the humidity temperature range of the SIM 130. When the logical signals $T_{SIM3}$ and $T_{SIM4}$ are respectively low and high, an error condition exists. This state has been included for the purposes of comprehensiveness, and cannot exist in a fully functional circuit board 100. When the logical signals $T_{SIM3}$ and $T_{SIM4}$ are respectively high and low, the measured temperature of the SIM 130 is below the humidity temperature range of the SIM 130. When the logical signals $T_{SIM3}$ and $T_{SIM4}$ are both high, the measured temperature of the SIM 130 is above the humidity temperature range of the SIM 130.

When the measured temperature of both the CPU 128 and SIM 130 are within the humidity temperature range (as indicated by logical signals $T_{CPU3}$ and $T_{CPU4}$ output from the second CPU thermostat 142(2) and logical signals $T_{SIM3}$ and $T_{SIM4}$ output from the second SIM thermostat 142(4)), the low-power heater switch 156 is closed and the high-power heater switch 158 is open, thereby providing power flow to the low-power heater 152 and preventing power flow to the high-power heater 154. In this switching state, the low-power heater 152 is turned on, and the high-power heater 154 is turned off. In this manner, the temperature of the circuit board 100 is maintained above the dew point temperature of the ambient air.

In accordance with a third thermal criterion, the power/thermal control circuitry 138, during extreme temperature conditions, maintains the temperatures of the CPU 128 and SIM 130 within the respective operating temperature ranges of the CPU 128 and SIM 130. That is, when the temperature of either the CPU 128 or SIM 130 is at the coldest fringe of the respective operating temperature ranges of the CPU 128 and SIM 130, the transient condition exists, in which case, both the low-power heater 152 and the high-power heater 154 are operated. Conversely, when the temperature of either the CPU or the SIM 130 is at the hottest fringe of the respective operating temperature ranges of the CPU 128 and SIM 130, neither the low-power heater 152 nor the high-power heater 154 is operated. The coldest and hottest fringes of the respective operating temperature ranges of the CPU 128 and SIM 130 are defined to fall inside the respective operating temperature ranges of the CPU 128 and SIM 130, but outside the defined humidity temperature range.

Thus, when the temperature of either the CPU 128 or the SIM 130 is at the coldest fringe of their respective operating temperature range (as indicated by the logical signals $T_{CPU1}$ and $T_{CPU2}$ output from the first CPU thermostat 142(1), logical signals $T_{SIM1}$ and $T_{SIM2}$ output from the first SIM thermostat 142(3), logical signals $T_{CPU3}$ and $T_{CPU4}$ output from the second CPU thermostat 142(2), and logical signals $T_{SIM3}$ and $T_{SIM4}$ output from the second SIM thermostat 142(4)), the low-power heater switch 156 and the high-power heater switch 158 are both closed, thereby providing power flow to the low-power heater 152 and high-power heater 154. In this switching state, the low-power heater 152 and high-power heater 154 are both turned on.

Conversely, when the temperature of either the CPU 128 or the SIM 130 is at the hottest fringe of their respective operating temperature range (as indicated by the logical signals $T_{CPU1}$ and $T_{CPU2}$ output from the first CPU thermostat 142(1), logical signals $T_{SIM1}$ and $T_{SIM2}$ output from the first SIM thermostat 142(3), logical signals $T_{CPU3}$ and $T_{CPU4}$ output from the second CPU thermostat 142(2), and logical signals $T_{SIM3}$ and $T_{SIM4}$ output from the second SIM thermostat 142(4)), the low-power heater switch 156 and the high-power heater switch 158 are both open, thereby preventing power flow to the low-power heater 152 and high-power heater 154. In this state, the low-power heater 152 and high-power heater 154 are both turned off.

As described above, the set points of the thermostats 142 can be programmed, based on the respective operating temperature ranges of the CPU 128 and SIM 130 and the defined humidity temperature range. FIG. 8 is a table setting forth exemplary values for the set point temperatures of the thermostats 142, with hysteresis temperatures in parentheses. Assuming that the operating temperature range of the CPU 128 is between −30° C. and 70° C., the low temperature set point of the first CPU thermostat 142(1) is set at −20° C., which leaves a 5° C. margin after accounting for the 5° C. built-in hysteresis. The high temperature set point of the first CPU thermostat 142(1) is set at 70° C. Accordingly, the resistance values of resistors R1–R3 are selected to be 9.09 kohms, 12.1 kohms, and 5.9 kohms, respectively. Assuming that the operating temperature range of the SIM 130 is between −20° C. and 70° C., the low temperature set point of the first SIM thermostat 142(3) is set at −15° C., which accounts for the 5° C. built-in hysteresis. The high temperature set point of the first SIM thermostat 142(3) is set at 70° C. Accordingly, the resistance values of resistors R7–R9 are selected to be 9.09 kohms, 11.3 kohms, and 6.49 kohms, respectively.

It is assumed that operation of the low-power heater 152 during a humidity temperature range between −10° C. and 55° C. is sufficient to maintain the temperature of the circuit board 100 above the dew point temperature of the ambient air. Accordingly, the low temperature set points of the second CPU thermostat 142(2) and second SIM thermostat 142(4) are set at −10° C., and the high temperature set points of the second CPU thermostat 142(2) and second SIM thermostat 142(4) are set at 55° C. Accordingly, the resistance values of resistors R4–R6 are selected to be 11 kohms, 8.66 kohms, and 7.15 kohms, respectively. Likewise, the resistance values of resistors R10–R12 are selected to be 11 kohms, 8.66 kohms, and 7.15 kohms, respectively.

FIG. 9 is a table setting forth the changes in the states of the CPU 128, SIM 130, low-power heater 152, and high-power heater 154 during a rise in the circuit board 100 temperature, given the thermal criteria defined above. When the measured temperature of either the CPU 128 or SIM 130 is below −40° C., and thus well below their respective operating temperature ranges, the transient condition exists. In this case, and assuming that operation of the circuit board 100 is presently desired, the low-power heater 152 and high-power heater 154 (in combination, the transient heater) are turned on to provide maximum heat to the circuit board 100, minimizing the time necessary to bring the temperature of the CPU 128 and SIM 130 within their respective operating temperature ranges.

When the measured temperature of the CPU 128 reaches −20° C., and the measured temperature of the SIM 130 reaches −15° C., at which time the temperatures of the CPU 128 and SIM 130 are within their respective operating temperature ranges, the transient condition no longer exists. In this case, the CPU 128 and SIM 130 are both turned on.

When the measured temperatures of both the CPU 128 and SIM 130 reach −10° C., the humidity condition exists, in which case, the high-power heater 154 is turned off, and the low-power heater 152 (by itself, the humidity heater) remains turned on. When the measured temperature of either the CPU 128 or the SIM 130 reaches 55° C., the humidity condition no longer exists. In this case, the low-power heater 152 is turned off to prevent the generation of additional heat. When the measured temperature of either the CPU 128 or the SIM 130 reaches 70° C., the CPU 128 and SIM 130 are turned off to prevent operation of the CPU 128 and SIM 130 outside of their respective operating temperature ranges.

FIG. 10 is a table setting forth the changes in the states of the CPU 128, SIM 130, low-power heater 152, and high-power heater 154 during a fall in the circuit board 100 temperature, given the thermal criteria defined above.

When the measured temperature of either the CPU 128 or the SIM 130 is above 65° C., the temperature of the respective CPU 128 or SIM 130 is above its respective operating temperature range, and therefore the CPU 128 and SIM 130 are assumed to be turned off. When the measured temperature of both the CPU 128 and SIM 130 reaches 65° C., the temperatures of the CPU 128 and SIM 130 are within their respective operating temperature ranges. In this case, and assuming that operation of the circuit board 100 is presently desired, the CPU 128 and SIM 130 are turned on. When the measured temperatures of both the CPU 128 and SIM 130 reach 55° C., the humidity condition exists, in which case, the low-power heater 152 (by itself, the humidity heater) is turned on. When the measured temperature of either the CPU 128 or the SIM 130 reaches −15° C., the humidity condition no longer exists. In this case, the high-power heater 154 is turned on (in combination with the low-power heater, a transient heater) to prevent the temperatures of the CPU 128 and SIM 130 from falling below their respective operating temperature ranges. When the temperature of the SIM 130 reaches −20° C. or the temperature of the CPU 128 reaches −25° C., the SIM 130 and CPU 128, as well as any other components on the circuit board 100, are turned off to prevent the SIM 130 and CPU 128 from operating outside of their respective operating temperature ranges.

Referring to FIG. 11, the low-power heater 152 comprises several banks of low-power resistive elements 160(1), and particularly five banks of eight low-power resistive elements 160(1). Similarly, the high-power heater 154 comprises several banks of high-power resistive elements 160(2), and particularly five banks of eight high-power resistive elements 160(2). It should be noted, however, that the number of banks of resistive elements 160, and the number of resistive elements 160 in each bank will vary with each design. As illustrated, the low-power resistive elements 160(1) and high-power resistive elements 160(2) are interleaved, such that the low-power heater 152 and high-power heater 154 lie virtually in the same area of the circuit board 100. In the preferred embodiment, the resistive elements 160 are planar, such that the resistive elements 160 can be made integral with the circuit board 100. In this manner, the resistive elements 160 can be more easily placed at selected locations on the circuit board 100. Additionally, the use of planar resistive elements 160 eliminates the need for external wiring, mounting hardware, additional assembly steps, and stocking/storing of discrete heaters. The use of planar resistive elements 160 can also reduce circuit board size and weight.

Electrical connection between the resistive elements 160 and the other circuitry within the circuit board 100 are made through electrically conductive contact pads 162 and/or electrically conductive traces 164. Specifically, the contact pad 162/trace 164 in contact with one side of each low-power resistive element 160(1) is electrically coupled to the power source 132 via the low-power heater switch 156, and the contact pad 162/trace 164 in contact with the other side of each low-power resistive element 160(2) is electrically coupled to ground (shown in FIGS. 2 and 3). Likewise, the contact pad 162/trace 164 in contact with one side of each high-power resistive element 160(2) is electrically coupled to the power source 132 via the high-power heater switch 158, and the contact pad 162/trace 164 in contact with the other side of each high-power resistive element 160(2) is electrically coupled to ground (shown in FIGS. 2 and 3).

FIG. 11-A particularly illustrates two contact pads 162, which are connected to the ends of a planar resistive element 160 to provide a convenient means of electrical connection thereto. The contact pads 162 are formed of an electrically conductive material, such as copper, and actually form a portion of the electrically conductive layer on which the resistive element 160 are disposed, as will be described in further detail below. Each contact pad 162 includes a plated through-hole or via 166 to provide electrical connection between the contact pads 162 and other electrically conductive layers. Preferably, the resistive element 160 is separated from the through-hole 166 by a minimum distance, such as 10 mils, to thermally isolate the resistive element 160 from the plated through-hole 166. In this manner, any thermal stress to which the resistive element 160 is subjected, which can be caused by the flow of heat through the through-hole 166 and contact pad 162 to the resistive element 160 during drilling, soldering, reflow, hot air leveling, etc, is minimized. Additionally, the separation between the through-hole 166 and the resistive element 160 provides chemical and mechanical isolation therebetween, which minimizes the possibility of resistive elements from being contaminated by chemicals, such as flux, and minimizes mechanical stress created at the junction between the contact pad 162 and the resistive element 160 caused by, e.g., drilling.

The low-power heater 152 and high-power heater 154 are configured to dissipate enough heat to satisfy the above-mentioned thermal criteria, given a specific operating voltage range of the circuit board 100. The amount of heat dissipated by the low-power heater 152 and high-power heater 154 is dependent on the size and resistance of resistive elements 160. In general, dissipation of heat is proportional to the number of resistive elements 160 and inversely proportional to the resistance of the resistive elements 160. It should be noted that, although the number of low-power resistive elements 160 and high-power resistive elements 160 are equal, the resistance of the low-power resistive elements 160 is greater than the resistance of the high-power resistive elements 160. By way of nonlimiting example, the total resistance of the low-power heater 152 (designated as R13 in FIG. 3) can be 16 ohms and the total resistance of the high-power heater 154 (designated as R14 in FIG. 3) can be 8 ohms. Thus, the higher resistive low-power heater 152 dissipates less heat than the lower resistive high-power heater 154.

Each planar resistive element 160 can be designed with a specific resistance value as follows. With regard to thin film-resistive material, the resistance is directly proportional to the length of the resistive film and inversely proportional to the cross-sectional area of the resistive film. Specifically, the resistance value of the resistive film is given by the equation:

$$R = \left(\frac{p}{h}\right)\left(\frac{L}{W}\right),$$

where R is the resistance of the resistive film in ohms; p is the resistivity constant of the resistive film in ohms-inches; and h, L, and W are respectively the thickness, length and width of the resistive film in inches. This equation can also be expressed as:

$$R = Rs\frac{L}{W} = Rs \times N,$$

where R is the resistance value of the resistive film in ohms; $R_s$ is the sheet resistance of the resistive film in ohms/square; L and W are respectively the length and width of the resistive film in inches; and N=the number of squares. Thus, the resistance value of the resistive film can be conveniently calculated by visualizing the resistive film as a series of squares. For example, the resistance value of resistive film having a sheet resistance of 25 ohms/square is: 25 ohms for a single square, 50 ohms for two linearly connected squares, 75 ohms for three linearly connected squares, and so on. The same resistive film would have a resistance of 12.5 ohms for a half square.

Thus, 25, 50, 75 and 12.5 ohm resistive elements 160(1), 160(2), 160(3) can be formed from resistive film having a sheet resistance of 25 ohms/square, as shown in FIGS. 12–15, respectively. Of course, resistive films can be manufactured with sheet resistances other than 25 ohms/square. Typical sheet resistances include 25 ohms/square, 50 ohms/square, 100 ohms/square and 200 ohms/square. Preferably, the sheet resistance or resistivity of the resistive film is such that the length of the resistive element can be made relatively short. For the purposes of this specification, a resistive element that is relatively short is less than the maximum dimension (length or width) of the circuit board. For example, a 600 ohm resistor that is 0.012 inches wide would have a length of 0.288 inches if it were constructed of a material (0.1 to 0.4 microns thick) having a sheet resistance of 25 ohms/square. In contrast, a 600 ohm resistor that is 0.012 inches wide and 0.0014 inches thick would have a length of 15,064 inches if it were constructed of copper. By using a substantially resistive material rather than a highly conductive material, resistive elements can be more easily placed on the circuit board 100 to provide localized heating without occupying an overly substantial amount of area on the circuit board 100. It should be noted, however, that this invention does not preclude the use of resistive elements that are not relatively short, i.e., resistive elements that are longer than the maximum dimension of the circuit board 100.

Figure 16:
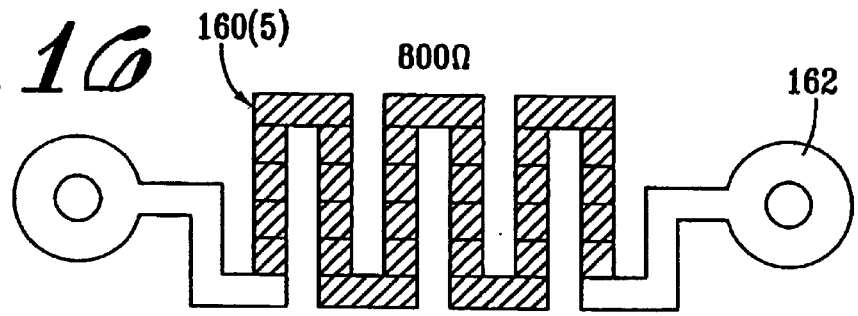
FIG. 16 is a plan view of an 800 ohm planar shorting-type resistive element.

The resistive elements 160 shown in FIGS. 12–15 can be considered bar-type resistor elements. As shown in FIG. 16, a shorting bar-type resistive element 160(5) is formed from several bar-type resistive elements connected in a series. The bar-type resistive elements follow a meandering pattern, thereby providing flexibility in locating the resistive element 160(5) on a circuit board. The total resistance value of the bar-type resistive elements 160(5), assuming a sheet resistance of 25 ohms/square, is 24 squares×25 ohms/square=800 ohms.

Figure 17:
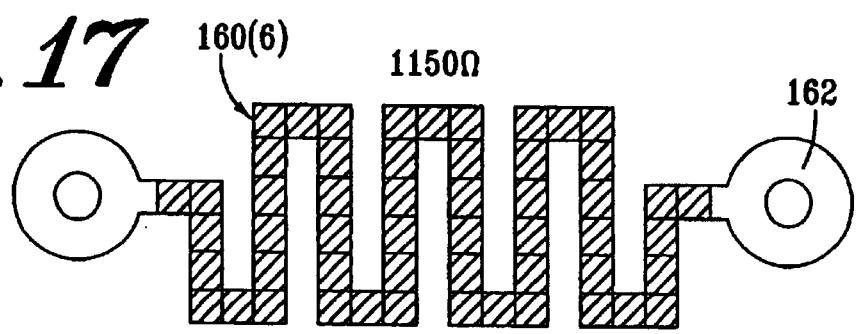
FIG. 17 is a plan view of an 1150 ohm planar meandering-type resistive element.
Figure 21:
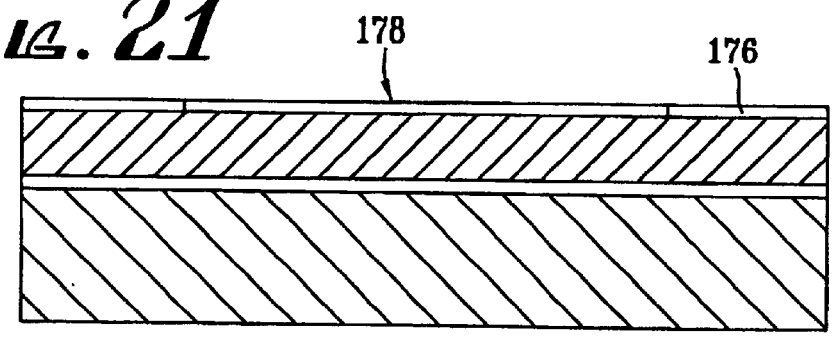

As shown in FIG. 17, a single meandering resistive element 160(6) is formed, which, like the shorting bar-type resistive element 160(5), provides flexibility in locating the resistive element 160 on the circuit board, due to its meandering pattern. The resistance value of the resistive element 160 can be calculated as described above, with the exception that the corner squares (right-angle bends) have an effective resistance value of 0.559 due to the change in current density at the right-angle path. Thus, the total number of effective squares formed by the resistive element 160 is 37+(16× 0.559)=45.9 squares, and thus the total resistance value of the resistive element 160, assuming a sheet resistance of 25 ohms/square, is 45.9 squares×25 ohms/square=1150 ohms.

With reference to FIGS. 18–24, the resistive elements 160 and contact pads 162/traces 164 are incorporated into the circuit board 100 using print and etch circuit board processing. For purposes of brevity in illustration, FIGS. 18–24 depict the formation of a single resistive element 160 with corresponding contact pads 162/traces 164. It should also be noted that some of the features illustrated in FIGS. 18–24 have been exaggerated, and thus are not necessarily to scale.

First, a thin film-resistive layer 168, such as Nickel-Phosphorous, is electro-deposited onto a copper foil or layer 170 to form resistor-conductor material 172 (FIG. 18). The thickness of the resistive layer 168 is typically between 0.1 and 0.4 microns, and thus, can be advantageously incorporated into the circuit board 100 without significantly increasing the thickness of the circuit board 100. The resistor-conductor material 172 is then laminated to a dielectric substrate material 174.

Figure 25:
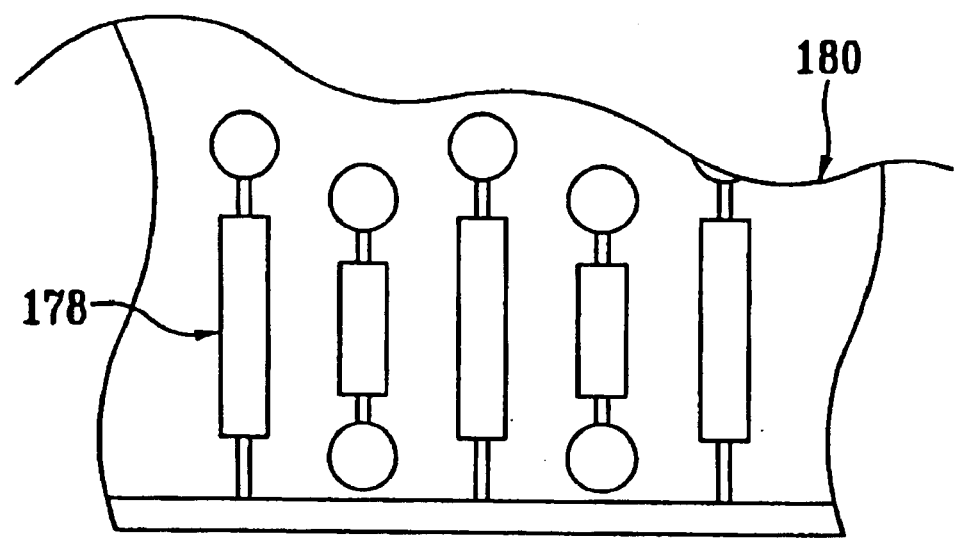
FIG. 25 is a plan view of a composite mask used to form a composite of the planar resistive elements and associated electrically conductive contact pads/traces.

The resistor-conductor material 172 is then processed, and in particular, imaged and etched, to produce the planar resistive elements 160 and contact pads 162/traces 164. Specifically, the copper layer 170 is coated with a photoresist 176 (FIG. 20). The photoresist 176 is then optically exposed through a composite mask to define a composite pattern 178 of unexposed photoresist 176 (FIG. 21), which represents the composite pattern of the resistive elements 160 and contact pads 162/traces 164. By way of nonlimiting illustration, a portion of an exemplary composite mask 180 is shown in FIG. 25. As can be appreciated, the composite pattern 178 defined by the composite mask 180 can be seen to correspond with the resistive elements 160 and contact pads 162/traces 164, as previously shown in FIG. 11.

Figure 22:
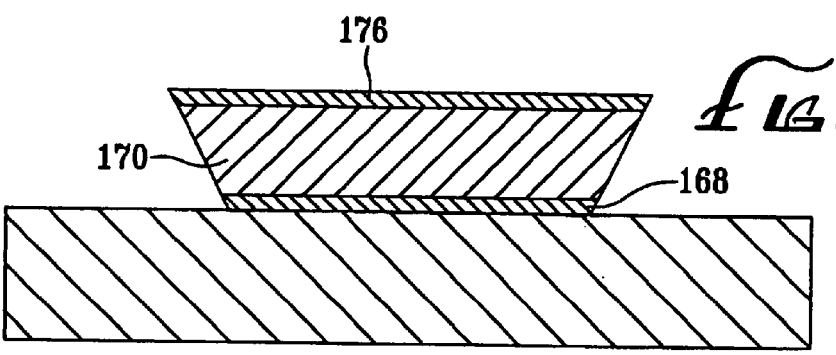
Figure 23:
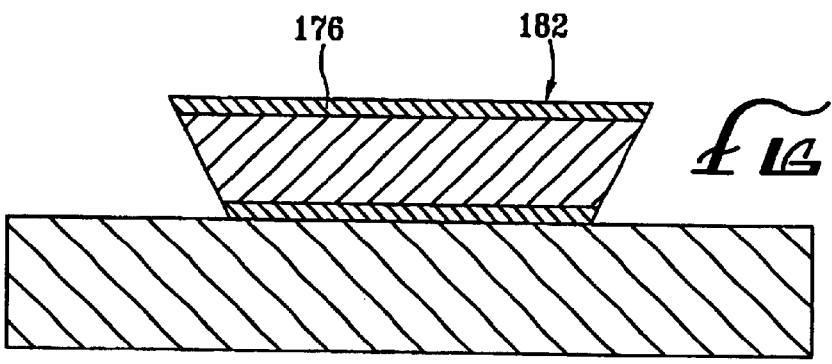

After the photoresist 176 has been exposed, a metal-resistive material etch is applied to the resistor-conductor material 172, thereby removing the exposed photoresist 176, and the portions of the copper layer 170 and resistive layer 168 underneath the exposed photoresist 176 (FIG. 22).

Figure 24:
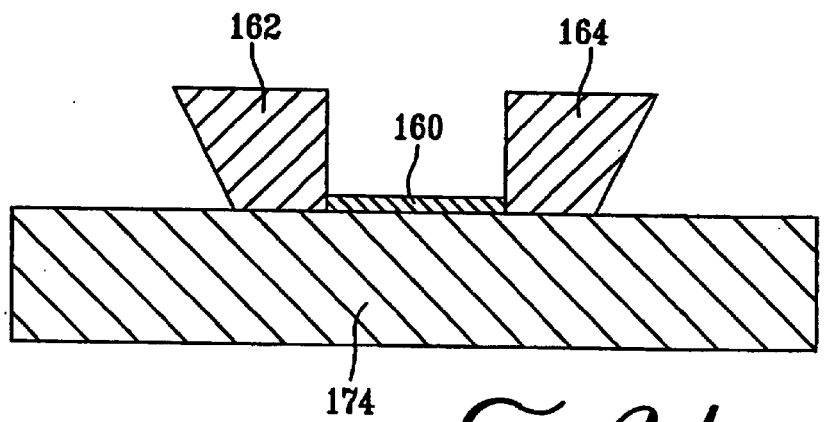
Figure 26:
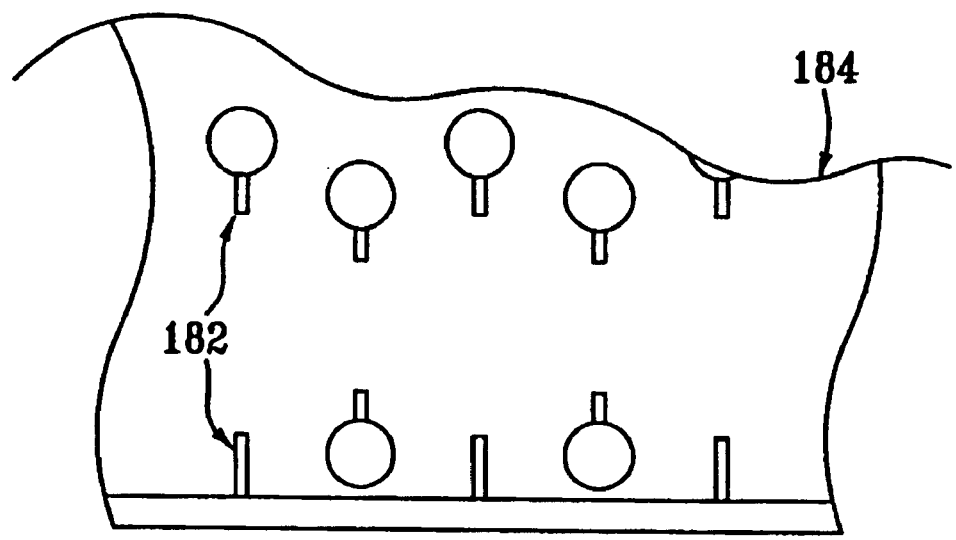
FIG. 26 is a plan view of a conductor-only mask used to form the planar resistive elements from the composite of FIG. 25.

The remaining photoresist 176 is then optically exposed through a conductor-define mask to define a conductor-only pattern 182 of exposed photoresist 176 (FIG. 23), which represents the pattern of contact Dads 162/traces 164 (shown in FIG. 11). By way of nonlimiting illustration, an exemplary conductor-define mask 184 is shown in FIG. 26. After the remaining photoresist 176 has been exposed, a metal-only etch is applied to the copper layer 170, thereby removing the exposed photoresist 176 and the portion of the copper layer 170 underneath the exposed photoresist 176. Because the metal-only etch does not dissolve resistive material, the portion of the resistive layer 168 underneath the exposed photoresist 176 remains. Thus, the contact pads 162/traces 164 and resistive elements 160 are defined on the dielectric substrate material 174 (FIG. 24). Further information regarding the manufacture of planar resistive elements can be obtained from Ohmega Technologies, Inc., located in Culver City, Calif.

It should be noted that the above process utilizes positive masks, which expose the portion of the photoresist to be etched away, along with the underlying layer. Negative masks, which expose the portion of the photoresist to remain after the etching process, along with the underlying layer, can be alternatively used, without straying from the principles taught by this invention.

The assembly of resistive elements 160, contact pads 162/traces 164 and dielectric substrate material 174, resulting from the above-described process, can be used to form one of the electrically conductive layers and associated substrate layers, shown in FIGS. 1 and 1-A. For example, the resistive elements 160 and contact pads 162/traces 164 can form a portion of the internal electrically conductive signal layer 110 (typically, other signal carrying contact pads and traces, not necessarily pertaining to the present inventions, will form the remaining portion of the signal layer 110), and the dielectric substrate material 174 can form the substrate layer 122. It should be noted that, by virtue of their disposition on the electrically conductive signal layer 110, the resistive elements 160 are effectively embedded within the circuit board 100. As such, the resistive elements 160 are not exposed to ambient air, thereby preventing the heat generated by the resistive elements 160 from quickly dissipating. In this manner, a more efficient means of heating the circuit board 100 is provided. Of course, the resistive elements 160 can be disposed on the other electrically conductive layers, such as the external electrically conductive layers 114 or 116, or the internal electrically conductive power or ground layers 108 or 112, without straying from the principles taught by this invention.

The low-power heater 152 and high-power heater 154, and thus the number, resistance, and location of the resistive elements 160, can be iteratively designed by utilizing finite-element analysis software, such as COSMOS® software, sold by Structure Research and Analysis Corporation of Santa Monica, Calif.

Specifically, the structure of the circuit board 100 can be thermally modeled, with the resistive elements 160 and any other power dissipating components providing a thermal source to the thermal model, and natural convention and radiation boundary conditions being applied to the bottom and top surfaces of the circuit board 100. The thermal sources to the model are input in power dissipation. In this regard, the power dissipated by a resistive element 160 can be calculated from the equation:

$$P=I^2R$$

where P is power in watts, I is the current flowing through the resistive element 160 in amps, and R is the resistance of the resistive element 160. For example, if the resistance of a resistive element 160 is 600 ohms, and the electrical current flowing through the resistive element 160 is 8.3 mA (assuming a voltage of 5 volts applied across the resistive element 160), the power dissipated from that resistive element 160 will be 0.043 W.

The power dissipated by any electronic components on the circuit board 100 can be obtained from a data book. It should be noted that, when modeling the circuit board during the transient condition, the power dissipated by any electronic components, other than the resistive elements 160, should not be taken into account since, during an actual transient condition, these components (namely, the CPU 128 and SIM 130) will not be turned on. When modeling the circuit board 100 during the humidity condition, however, the power dissipated by all electronic components, including the resistive elements 160, should be taken into account.

Figure 27:
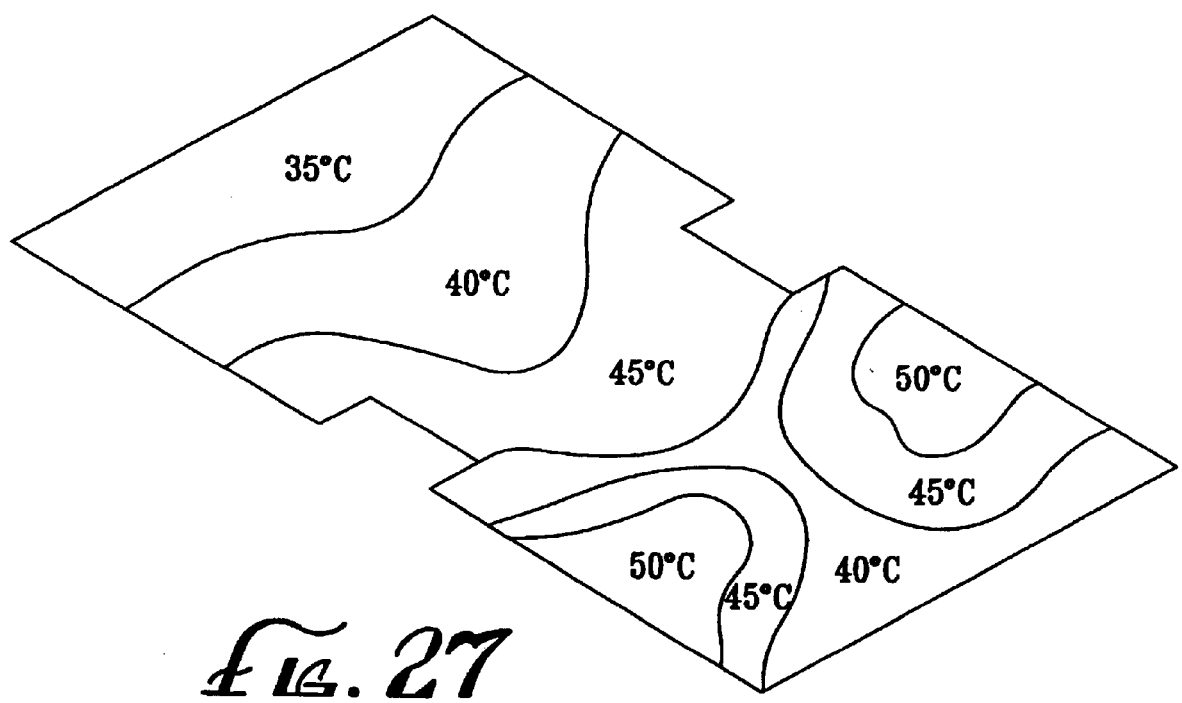
FIG. 27 is a thermal contour plot generated from a thermal finite element analysis of the circuit board of FIG. 1.

The output of the thermal model provides an indication as to whether the resistive elements 160 are designed, such that the thermal criteria, set forth above, has been satisfied. For example, the temperature at any location on the circuit board 100 can be determined from a temperature contour plot, such as that shown in FIG. 27. Those locations on the temperature contour plot that correspond to the locations of the critical components (such as the CPU 128 and SIM 130) can then be isolated and analyzed to determine if the size, resistance and location of the resistive elements 160 have been properly selected.

By way of nonlimiting example, the transient temperature response of the CPU 128 during the transient condition can be approximated by tracking the temperature of the location of the circuit board 100 corresponding to the location of the CPU 128. If the temperature of that circuit board location rises above the lower operating temperature range of the CPU 128 within the time set forth by the first thermal criterion, then the size, resistance, and location of the resistive elements 160 have been properly selected, thereby providing the CPU 128 with a reasonable start-up time during the transient condition.

By way of another nonlimiting example, during the humidity condition, the minimum temperature on the circuit board 100 can be obtained to determine if that temperature exceeds the ambient temperature by a temperature (such as 10° C.) sufficient to prevent condensation of moisture. If the temperature difference meets or exceeds the temperature difference threshold set forth by the second thermal criterion, the size, then resistance, and location of the resistive elements 160 have been properly selected, thereby providing the circuit board 100 with enough heat to prevent condensation of moisture thereon.

The thermal finite-element analysis of the circuit board 100 can be verified by actually subjecting the circuit board 100 to temperature conditions to which the circuit board 100 is expected to be subjected to in the field, and measuring the temperature at various locations on the circuit board 100 during these tests.

Prior to temperature testing, the basic functionality of the circuit board 100 is preferably tested. In particular, the regulator output voltage is tested to ensure that it is within specification. The output pins OUT1 and OUT2 of the thermostats 142 are tested to ensure that they yield correct logical signals at room temperature. The logic of the logic unit 140, such as the shutdown control signal $S_{SHUT}$, and the heater control signals $S_{LHTR}$ and $S_{HHTR}$, is tested to ensure that it is correct, given various inputs to the logic unit 140. The resistances of the low-power heater 152 and high-power heater 154 are measured to determine if they are within specification.

Prior to temperature testing, the temperature set point functionality of the thermostats 142 are preferably tested at various ambient temperatures. In cases where ambient temperatures, other than room temperature, are needed, a Thermotron chamber can be used. To test each temperature set point, the ambient temperature should be brought more than 5° C. below the temperature set point, and then raised up (at a rate much greater than would occur in natural outdoor environmental conditions) through that temperature set point. Once the output pin corresponding to the temperature set point switches from high to low, the temperature is noted to determine the actual temperature set point. The ambient temperature is then lowered through the hysteresis temperature. Once the output pin switches from low to high, the temperature is noted to determine the actual hysteresis temperature. The actual temperature set point and hysteresis temperature can then be compared with the design set point temperature and hysteresis temperature, and adjustments in the design temperature set point can be accomplished by adjusting the appropriate resistors, i.e., the resistors R1–R12 corresponding to the temperature set point.

Once the basic functionality and temperature set point functionality have been tested, the thermal functionality of the circuit board 100 can then be tested. A Fluke Hydra Data Logger with thermocouple inputs can be used to measure the temperature at various locations on the circuit board 100, while a Thermotron chamber is used to maintain the desired ambient temperature. To provide accurate and consistent results, the circuit board 100 is preferably soaked at the appropriate temperature, and then once soaked, the circuit board 100 is powered on. To test the circuit board 100 during the transient condition, the circuit board 100 is first soaked at −40° C. The circuit board 100 is then started up. The temperatures of the CPU 128 and SIM 130 can then be measured to determine if these temperatures reach the operating temperature ranges of the CPU 128 and SIM 130 within the period of time defined by the thermal criteria (such as 15 minutes). As an alternative to testing in the Thermotron chamber at cold temperatures, tests can be performed on the circuit board 100 at room temperature. The temperature rises of the CPU 128 and SIM 130 above the ambient temperature can then be used to project the temperature rise of the CPU 128 and SIM 130 above the ambient temperature as if the circuit board 100 was soaked in an extreme cold temperature, such as −40° C., and then started up.

To test the circuit board 100 during the humidity condition, the circuit board 100 is soaked at a temperature within the defined humidity temperature range, such as 25° C. The circuit board 100 is then started up. The temperature of the circuit board 100 can then be measured at various locations to determine if the difference between these temperatures and the ambient temperature exceeds the differential temperature as defined by the thermal criteria (such as 10° C.).

Thus, an improved apparatus and method for thermally controlling a circuit is described. While embodiments and applications of this invention have been shown and described, it would be apparent to those skilled in the art that many more modifications are possible without departing from the inventive concepts herein.

The invention, therefore, is not to be restricted except in the spirit of the appended claims.

What is claimed is:

1. A circuit board, comprising:
   a substrate;
   a heater comprising one or more planar resistive elements composed of a substantially resistive material, said one or more planar resistive elements being carried by a said substrate;
   a power source selectively coupled to said heater; and
   thermal control circuitry configured for selectively coupling said power source to said heater such as to generate at least first and second heating power levels responsively to respective conditions detectable by said thermal control circuitry.

2. The circuit board of claim 1, wherein said substrate is rigid.

3. The circuit board of claim 1, wherein said substrate is flexible.

4. The circuit board of claim 1, wherein said thermal control circuitry comprises:
   at least one thermostat and logic circuit configured to generate at least four set points, including two high and two low set points, such that at least first and second temperature ranges are defined, said logic circuit being configured to actuate said first heating power level responsively to a detected temperature being in said first temperature range and to actuate said heating power level responsively to said detected temperature being in said second temperature range.

5. A circuit board, comprising:

a substrate;

a heater comprising one or more planar resistive elements composed of a substantially resistive material, said one or more planar resistive elements being carried by said substrate;

a power source selectively coupled to said heater; and thermal control circuitry configured for selectively coupling said power source to said heater;

wherein said thermal control circuitry comprises:

a thermostat having a temperature set point, said thermostat configured to sense a temperature level and output a signal when said temperature level crosses said temperature set point;

a switch operatively coupled to said power source and said heater to selectively couple said power source to said heater and decouple said power source from said heater; and a logic unit programmed to operate said switch based on said thermostat output signal.

6. The circuit board of claim 5, wherein said thermostat includes hysteresis.

7. The circuit board of claim 5, wherein said thermostat is configured to output a first signal when said temperature level is greater than said temperature set point and output a second signal when said temperature level is less than said temperature set point; and wherein said logic unit is programmed to operate said switch to couple said power source to said heater in response to said second signal, and decouple said power source from said heater in response to said first signal.

8. The circuit board of claim 5, further comprising a functional electronic component, wherein said thermal control circuitry comprises another switch operatively coupled to said power source and said functional electronic component to selectively couple said power source to said functional electronic component and decouple said power source from said functional electronic component, and wherein said logic unit is further programmed to operate said another switch based on said thermostat output signal.

9. The circuit board of claim 8, wherein said temperature level is sensed at said functional electronic component.

10. The circuit board of claim 8, wherein said temperature is sensed at said substrate.

11. The circuit board of claim 8, wherein said thermostat is configured to output a first signal when said temperature level is greater than said temperature set point and to output a second signal when said temperature level is less than said temperature set point; and wherein said logic unit is programmed to operate said another switch to couple said power source to said functional electronic component in response to said second signal, and decouple said power source from said functional electronic component in response to said first signal.

12. A circuit board having a temperature-sensitive functional electronic component thereon, comprising:

a substrate;

a heater comprising one or more planar resistive elements composed of a substantially resistive material, said one or more planar resistive elements being carried by said substrate;

a power source selectively coupled to said heater; and thermal control circuitry configured for selectively coupling said power source to said heater to maintain said functional electronic component within predefined temperature limits;

said thermal control circuitry being configured for selectively coupling said power source to said functional electronic component.

13. The circuit board of claim 12, wherein said heater and said thermal control circuitry are configured to satisfy one or more predetermined thermal criteria.

14. The circuit board of claim 13, wherein said one or more predetermined thermal criteria includes raising the temperature of the circuit board to a predetermined temperature level in a predetermined period of time.

15. The circuit board of claim 13, wherein said one or more predetermined thermal criteria includes maintaining the temperature of one or more components mounted on the circuit board within the operating temperature range of said one or more components.

16. The circuit board of claim 13, wherein said one or more predetermined thermal criteria includes maintaining a surface of said substrate at a temperature above the dew point temperature of the ambient air.

17. A circuit board, comprising:

a substrate;

a heater comprising one or more resistive elements composed of a substantially resistive material, said one or more resistive elements being embedded within said substrate; and at least one thermostat and logic circuit configured to generate at least four set points, including two high and two low set points, such that at least first and second temperature ranges are defined, said logic circuit being configured to actuate a first heating power level responsively to a detected temperature being in a first temperature range and to actuate a second heating power level responsively to a detected temperature being in said second temperature range.

18. The circuit board of claim 17, wherein said heater comprises one or more banks of resistive elements.

19. The circuit board of claim 17, wherein said substrate is rigid.

20. The circuit board of claim 17, wherein said substrate is flexible.

21. The circuit board of claim 17, wherein said one or more resistive elements are planar.

22. The circuit board of claim 17, further comprising one or more functional electronic components carried by said substrate.

23. The circuit board of claim 17, wherein said heater is configured to dissipate a level of heat that satisfies one or more predetermined thermal criteria.

24. The circuit board of claim 23, wherein said one or more predetermined thermal criteria includes raising the temperature of the circuit board to a predetermined temperature level in a predetermined period of time.

25. The circuit board of claim 23, wherein said one or more predetermined thermal criteria includes maintaining the temperature of one or more components mounted on the circuit board within the operating temperature range of said one or more components.

26. The circuit board of claim 23, wherein said one or more predetermined thermal criteria includes maintaining a surface of said substrate at a temperature above the dew point temperature of the ambient air.

27. The circuit board of claim 17, wherein said substantially resistive material has a resistivity greater than 200 ohm-nanometers at 20 degrees C.

28. The circuit board of claim 17, wherein said substantially resistive material is selected from a group consisting of: a nickel-chromium-iron alloy, a nickel-copper alloy, Lead and Nickel-Phosporous.

29. A circuit board having a temperature sensitive component thereon, comprising:

a substrate; and a heat carried by said substrate, said heater comprising one or more planar resistive elements composed of a substantially resistive material;

a temperature controller configured to activate and deactivate said heater and said component responsively to a sensed temperature of said component.

30. The circuit board of claim 29, wherein said substrate is formed of a plurality of substrate layers, and said heater is carried within said substrate layers.

31. The circuit board of claim 29, wherein said substrate is formed of a plurality of substrate layers, and said heater is carried by an external surface of said substrate.

32. The circuit board of claim 29, wherein said one or more planar resistive elements are each connected to one or more electrically conductive traces.

33. The circuit board of claim 29, wherein said substrate is rigid.

34. The circuit board of claim 29, wherein said substrate is flexible.

35. The circuit board of claim 29, wherein said heater comprises a bank of planar resistive elements.

36. The circuit board of claim 29, further comprising one or more functional electronic components carried by said substrate.

37. The circuit board of claim 29, wherein said substantially resistive material comprises nickel-phosphorous.

38. The circuit board of claim 29, wherein said substantially resistive material has a resistivity greater than 200 ohm-nanometers at 20 degrees C.

39. The circuit board of claim 29, wherein said substantially resistive material is selected from a group consisting of: a nickel-chromium-iron alloy, a nickel-copper alloy, Lead and Nickel-Phosporous.

40. The circuit board of claim 29, wherein each of said one or more planar resistive elements has a relative short length.

41. A circuit board having a temperature-sensitive component, comprising:

a substrate having a surface exposed to ambient air;

one or more heaters carried by said substrate, wherein said one or more heaters dissipates multiple levels of heat, generating a low heat output rate to maintain said substrate surface at a temperature above the dew point temperature of the ambient air and a high heat output rate to maintain said substrate surface temperature above an operating temperature of said component.

42. The circuit board of claim 41, wherein each of the said one ore more heaters comprises one or more resistive elements embedded within said substrate.

43. The circuit board of claim 41, wherein said one or more heaters comprises one or more planar resistive elements.

44. The circuit board of claim 41, further comprising:

a power source selectively coupled to said one ore more heaters; and thermal control circuitry configured for selectively coupling said power source to said one or more heaters, wherein said one or more heaters and said thermal control circuitry are configured for maintaining the temperature of said substrate surface at least at a predetermined level above the ambient temperature.

* * * * *

UNITED STATES PATENT AND TRADEMARK OFFICE
CERTIFICATE OF CORRECTION

PATENT NO. : 6,621,055 B2  Page 1 of 1
DATED : September 16, 2003
INVENTOR(S) : Weber et al.

It is certified that error appears in the above-identified patent and that said Letters Patent is hereby corrected as shown below:

<u>Column 14,</u>
Line 27, after "160(3)", insert -- and 160(4) --.

<u>Column 15,</u>
Line 46, delete "Dads", insert -- pads --.

Signed and Sealed this

Twenty-fifth Day of May, 2004

JON W. DUDAS
*Acting Director of the United States Patent and Trademark Office*